United States Patent [19]

Diamondstein et al.

[11] Patent Number: 5,432,804
[45] Date of Patent: Jul. 11, 1995

[54] DIGITAL PROCESSOR AND VITERBI DECODER HAVING SHARED MEMORY

[75] Inventors: Marc S. Diamondstein, Allentown; Homayoon Sam, Wescosville; Mark E. Thierbach, South Whitehall Township, Lehigh County, all of Pa.

[73] Assignee: AT&T Corp., Murray Hill, N.J.

[21] Appl. No.: 153,405

[22] Filed: Nov. 16, 1993

[51] Int. Cl.[6] .................................... G06F 11/10
[52] U.S. Cl. ........................ 371/43; 375/340
[58] Field of Search ............ 371/43, 41; 375/94; 364/131, 133, 134, 228, 228.6, 232.8

[56] References Cited

U.S. PATENT DOCUMENTS

| | | | |
|---|---|---|---|
| 4,536,878 | 8/1985 | Rattlingourd et al. | 371/43 |
| 4,606,027 | 8/1986 | Otani | 371/43 |
| 4,763,328 | 8/1988 | Shimoda et al. | 371/43 |
| 4,860,191 | 8/1989 | Nomura et al. | 364/DIG. 1 |
| 4,896,264 | 1/1990 | Boddie | 364/200 |
| 5,144,644 | 9/1992 | Borth . | |
| 5,151,904 | 9/1992 | Reiner et al. | 371/43 |
| 5,193,094 | 3/1993 | Viterbi | 371/43 |
| 5,204,874 | 4/1993 | Falconer et al. . | |
| 5,220,570 | 6/1993 | Lou et al. | 371/43 |
| 5,331,665 | 7/1994 | Busschaert et al. | 371/43 |

OTHER PUBLICATIONS

Steele, Raymond, *Mobile Radio Communications*, Appendix D, Overview of the Viterbi Algorithm, Pentech Press Ltd., London, 1992, pp. 704–712.

Ellard, G. S. and J. P. Sweeney, AT&T Cellular Applications Engineering, *DSP Applications*, Algorithm Implementation Examples for Digital Cellular Communication, Mar. 1993, pp. 53–65.

*Primary Examiner*—Roy N. Envall, Jr.
*Assistant Examiner*—Steven R. Garland
*Attorney, Agent, or Firm*—James H. Fox

[57] ABSTRACT

An integrated circuit includes a digital signal processor (DSP) and an error correction co-processor (ECCP) that implements a Viterbi decoding function. The DSP and ECCP share a block of multi-port memory, typically by bus multiplexing a dual-port RAM. When the ECCP possesses the RAM, it inhibits the DSP from accessing that block of the RAM by asserting an EBUSY flag. This technique conserves and optimizes the RAM usage, allowing the DSP and ECCP to advantageously be formed on the same integrated circuit chip.

9 Claims, 2 Drawing Sheets

DIGITAL PROCESSOR AND VITERBI DECODER HAVING SHARED MEMORY

CROSS-REFERENCE TO RELATED APPLICATION

This application is related to the following concurrently filed, co-pending applications, each of which is incorporated herein by herein by reference:

Application Ser. No. 08/153,334, entitled "Efficient Utilization of Present State/Next State Registers", filed Nov. 16, 1993, by D. Blaker, M. Diamondstein, G. Ellard, M. Mobin, H. Sam, and M. Thierbach;

Application Ser. No. 08/152,531, entitled "Variable Length Tracebacks", filed Nov. 16, 1993, by D. Blaker, G. Ellard, and M. Mobin;

Application Ser. No. 08/153,333, entitled "Power and Time Saving Initial Tracebacks", filed Nov. 16, 1993, by D. Blaker, G. Ellard, and M. Mobin;

Application Ser. No. 08/152,805, entitled "Digital Receiver with Minimum Cost Index Register", filed Nov. 16, 1993, by D. Blaker, G. Ellard, M. Mobin and H. Sam;

Application Ser. No. 08/152,807, entitled "Digital Signal Processor", filed Nov. 16, 1993, by D. Blaker, G. Ellard, M. Mobin, and M. Thierbach; and Application Ser. No. 08/153,391, entitled "Digital Signal Processor", filed Nov. 16, 1993, by D. Blaker, G. Ellard and M. Mobin.

BACKGROUND OF THE INVENTION

1. Field of the Invention

The present invention relates to an integrated circuit having a digital processor, a Viterbi decoder, and a shared memory.

2. Description of the Prior Art

Viterbi decoders are used in signal processing applications to give an improved estimate of a received digital signal sequence in the face of channel noise. For example, cellular telephones are increasingly moving to digital transmission techniques of various types. One digital standard (GSM) has been generally adopted for use in Europe, while another (IS54) is intended for use in North America, with still others under consideration. However, the nature of cellular transmission and reception, often occurring from moving vehicles or pedestrians, gives rise to a variety of channel disturbances. For example, multi-path interference exists when reflections from nearby objects causes several signals, delayed in time from the original signal, to be received. Therefore, the received digital sequence may not exactly match the transmitted sequence. The digital sequences are sent in "packets" having a desired number of digital bits, which may be fixed, or alternatively variable, in order to compensate for transmission difficulties. The above-noted standards provide various forms of Forward Error Correction (FEC), by which additional bits are included in the packets to provide a degree of redundancy in transmission, so that errors may be detected and corrected to some degree at the receiving end. The packets may contain digitized voice information or other forms of data, including computer files, video information, etc.

A Viterbi trellis decoder is one commonly used method of decoding the received packets in order to recover the transmitted sequence. That is, given the properties of the FEC encoder used, some sequences of bits are more likely than others. Therefore, the Viterbi decoder provides a MLSE (Most Likely Sequence Estimation) deconvolution output, to more accurately recover the transmitted sequence in the face of channel noise and distortion of various types. In addition to correcting errors due to random noise, a Viterbi decoder can improve receiver performance in the presence of multi-path interference, since the received digits are then not independent of one another, but correlated to some degree. The decoding of a known bit sequence can then be used to adjust the tap weights of an equalizer, which compensates for the multi-path interference. Therefore, a knowledge of the history of a received signal sequence can be used to improve the accuracy of recovering the signal sequence that was actually sent. An overview of the Viterbi decoding technique is given in "Overview of the Viterbi Algorithm", *Mobile Radio Communications*, R. Steele (editor), Pentech, London (1992).

In the prior art, the Viterbi decoder has been implemented in one or more integrated circuits. The control circuitry that instructs the Viterbi is implemented on one or more other integrated circuits. In some cases, the control circuitry is of limited flexibility in terms of the ease of passing instructions to the Viterbi decoder. Furthermore, the complexity of the circuit functions has hindered their economical inclusion in a single integrated circuit. It is desirable to implement a Viterbi decoder that obtains improved functionality and ease of programming, while reducing the total number of integrated circuits needed to implement the desired functionality.

SUMMARY OF THE INVENTION

We have invented an integrated circuit that includes a digital processor and a Viterbi decoder. The digital processor and the Viterbi decoder time-share a memory. The memory space may be allocated to the Viterbi decoder in an amount that varies according to the needs of the decoder.

DETAILED DESCRIPTION

The following detailed description relates to an integrated circuit that includes a digital processor and Viterbi decoder, along with a memory that is time-shared between them. As used herein, the term "digital processor" includes microprocessors, microcontrollers, and digital signal processors (DSPs), among other types. The present technique is especially advantageously implemented with DSPs, which is illustratively shown herein. This is due to a DSP's well-known ability to efficiently handle various signal processing functions associated with digital communications, as well as digitized analog communications. Such functions include Fast Fourier Transforms (FFTs), digital filtering, tone generation, speech encoding and decoding, etc. A "Viterbi decoder" as used herein includes decoders that implement the Viterbi algorithm to obtain either or both of: (1) equalization that compensates for multi-path interference (often referred to as "MLSE equalization"

in the art), or (2) channel deconvolution to recover the transmitted signal.

Figure 1:
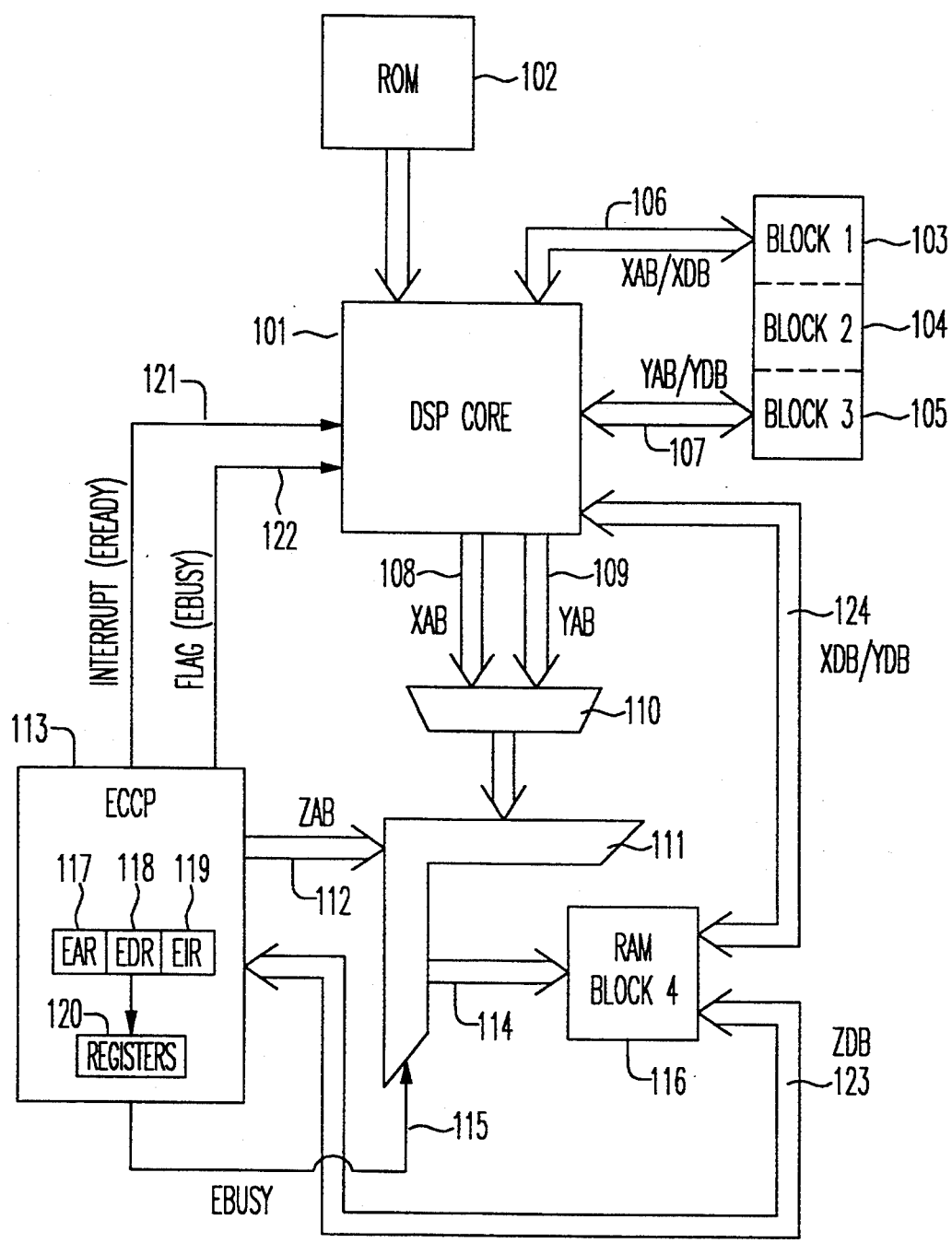
FIG. 1 shows one embodiment of an integrated circuit that implements the present invention.

Referring to FIG. 1, an illustrative embodiment of the present invention is shown. A digital signal processor "core" (101) illustratively comprises an addressing unit for accessing fixed (X) data (typically program instructions and coefficients), another addressing unit for accessing variable (Y) data, and a Data Arithmetic Unit (DAU). Various other functions may optionally be implemented in other logic blocks (not shown), including serial to parallel (and parallel to serial) input/output functions, and bit manipulation for performing normalization, finding exponents, bit extraction and insertion, barrel shifting, etc. The ROM 102 typically provides instructions and coefficients to the core. A random access memory comprises memory banks 103, 104 and 105. These serve as a fast cache memory to rapidly provide the program instructions and coefficients initially stored in the ROM to the core, and also provides data to the core. The memory banks are each 1 kiloword in size, using 16 bit words, in the illustrative case. The bus 106 provides for communicating address and data information between the X addressing unit in the core and the memory. The bus 107 provides for communicating address and data information between the Y addressing unit in the core and the memory. This type of cache memory architecture, which has been successfully used in commercial DSPs, is shown in U.S. Pat. No. 4,896,264, with various other types being possible. Note that the memory (banks 103, 104, 105) may function as a dual-port random-access memory (DPRAM), by multiplexing the X and Y busses (106, 107) using a multiplexer (not shown) to select one or the other at any given time, thereby avoiding possible contentions.

The core is capable of reading and writing registers in the ECCP (Error Correction Co-Processor) 113, which implements the Viterbi decoding function. For example, the DSP core may load parameters and control words into the ECCP. The core is also capable of receiving interrupts and flags from the ECCP. The DSP core also communicates to another (i.e., fourth) memory block 116, which is illustratively also of multi-port design, being tri-ported in this embodiment by means of multiplexers 110 and 111. The multiplexer 110 chooses either X address bus 108 or alteratively Y address bus 109 to supply one input to the multiplexer 111. The multiplexer 111 chooses either the output of the multiplexer 110, or alternatively the Z address bus 112 from the ECCP 113. The chosen bus then supplies addresses to the shared memory 116 (via bus 114) for selecting desired memory locations for access. The shared memory 116 communicates data to and from the ECCP by means of Z data bus 123, and communicates data to and from the DSP by means of a multiplexed X and Y data bus 124. The present invention provides for improved utilization of memory by time-sharing the memory block 116 between the DSP core and the ECCP. The ECCP uses a first portion of the memory block 116 for storing the trellis used in determining the optimum path inside the trace-back memory when performing the Viterbi decoding function. On the other hand, the DSP uses a second portion of the memory block for whatever functions it is performing. Hence, instruction codes and/or data may be stored in the second portion.

In the illustrative embodiment, the DSP communicates control instructions and data to the ECCP by means of registers 117, 118, and 119. The ECCP Address Register (EAR) 117, illustratively 11 bits in length, is supplied with the address of the various data registers that the DSP is to communicate with. The ECCP Data Register (EDR) 118, illustratively 16 bits, is a port that allows access to a number of other ECCP registers 120. These other ECCP registers, having up to $2^{11}$ locations in the illustrative case, store input symbols and channel parameters communicated from the DSP to the ECCP. The ECCP Instruction Register (EIR) 119, illustratively 3 bits, stores the control instructions from the DSP that the ECCP is to perform. The foregoing register technique allows for indirectly addressing the ECCP; alternatively, the ECCP could directly map into the DSP memory space, with the present invention not being limited to the nature of the technique used.

Figure 2:
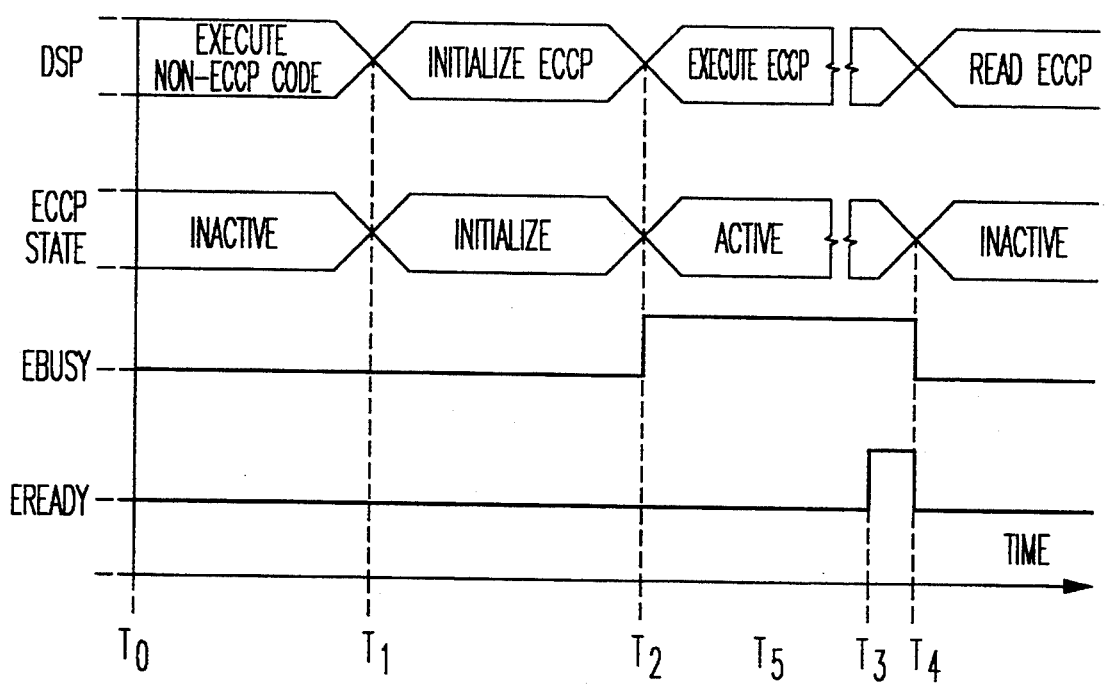
FIG. 2 shows a timing diagram that illustrates the time-sharing of a memory.

Referring to FIG. 2, the voltage on the EBUSY line is shown. A first portion of this line (122) supplies the EBUSY flag signal to the DSP core 101, whereas a second portion of the EBUSY line (115) controls the multiplexer 111. The signals on these portions are logically equivalent. Therefore, these portions (115, 122) may be electrically connected together, or driven separately by the ECCP. At time $T_0$ the ECCP sets EBUSY in a low voltage state (logic "0") to indicate that the DSP has exclusive access to the shared memory block. This allows the DSP to execute non-ECCP code for any function the DSP needs to perform. When the DSP has finished executing this code at time $T_1$, it initializes the ECCP. At time $T_2$, the DSP writes the EIR with an ECCP instruction. As a result, ECCP sets EBUSY in a high voltage state (logic "1") to indicate that the ECCP has exclusive access to the shared memory block. In other words, EBUSY is asserted if the ECCP is active, allowing it to execute the Viterbi decoding using a new signal value provided by the DSP. After each input symbol is processed, the ECCP relinquishes control of the memory by again setting EBUSY low at time $T_4$, allowing the DSP to have access to the shared memory. In addition, the DSP may read the ECCP to determine the decoded symbol that resulted from the Viterbi decoding. The EBUSY signal may be considered to represent a flag in this form of handshaking between the DSP and the ECCP.

Alternatively or additionally, an interrupt signal (EREADY) may be used to facilitate handshaking between the DSP and the ECCP. The interrupt signal typically takes the form of a pulse that is sent at time $T_3$ when the ECCP is ready to relinquish control of the shared memory to the DSP. Therefore, the EREADY line 121 is also controlled by the ECCP, as shown in FIG. 1. The ECCP retains control until it has finished its desired operation, and thereafter returns control to the DSP.

In the above manner, an entire frame of input symbols may be decoded by the ECCP. Each frame typically comprises about 120 to 150 input symbols, with each symbol typically requiring 20 to 150 clock cycles to decode. In operation, the DSP and the ECCP communicate with each other, and the shared memory block, as follows, assuming initially that the ECCP is performing a decoding operation:

(1) Before accessing the shared memory, the DSP checks the state of the EBUSY flag via a conditional instruction. It polls the EBUSY flag (line 122) until its value is low, at which time the DSP can safely access the shared memory. A typical instruction sequence is thus:
wait:
if EBUSY goto wait continue: accessRAM (2) Before relinquishing the shared memory block, the ECCP performs its decoding operation, which typically runs for a number of clock cycles to process a symbol, as noted above.

(3) When it is finished, the ECCP interrupts the DSP, by means of the interrupt line 121 (EREADY), thereby relinquishing the use of the memory block 116 to the DSP.

(4) The DSP accesses the shared memory block to perform the desired operation.

Hence, in the above embodiment, the DSP and ECCP communicate by the use of a flag and/or an interrupt, in order to accomplish the sharing of the memory 116. The flag is illustratively a single bit line that the DSP polls to determine if the ECCP is still running its decoding operation. The interrupt is a signal that the ECCP provides to the DSP to indicate that the ECCP is finished with its current operation. However, other forms of handshaking are possible in order to accomplish the sharing of the memory. The above-noted sharing of the memory block 116 is facilitated by the fact that in typical operations, the ECCP requires access to the shared memory less than half of the time, and typically less than 10 percent of the time. Therefore, the DSP is free to perform its various other operations using the shared memory for the majority of the time. Of course, the DSP is also free to use the various non-shared memory resources (e.g., blocks 103, 104 and 105) at all times insofar as the ECCP operation is concerned.

Figure 3:
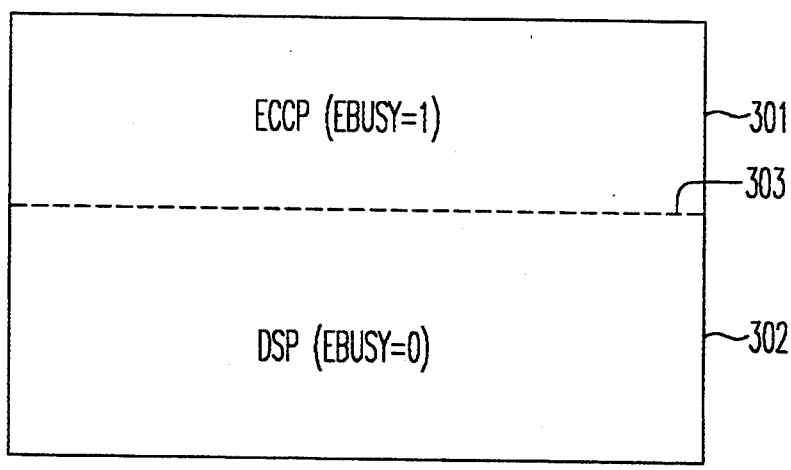
FIG. 3 shows a memory space having a parametric boundary.

Referring to FIG. 3, the shared memory block 116 is illustrated, with the first portion 301 used by the ECCP, and the second portion 302 used by the DSP. The second portion 302 is available to the DSP whenever EBUSY is low, whereas 301 is available to the DSP only between frames. A "boundary" 303 is shown separating these portions. This boundary is typically implemented in the software that controls the ECCP, and hence is not a physical boundary. However, boundary 303 illustrates that certain memory address locations (e.g., 0 to X), lie within the ECCP portion, and the other memory address locations (e.g., X+1 to 1023) lie within the DSP portion of the illustrative 1024 bit (1 kilobit) memory. The boundary 303 is parametric in a presently-preferred embodiment, so that the ECCP uses only the amount of memory that is necessary at a given time. Therefore, the maximum amount of memory is freed up for use by the DSP to implement its functions.

In a typical embodiment, the amount of memory that is used by the ECCP is based primarily on the desired "constraint length", which in the illustrative case is contained in a 3-bit programmable field in the ECCP control register, being one of the registers (120) that is indirectly addressed by the EAR (117). These 3 bits provide for 8 different memory requirements, up to a maximum of 512 words (16 bits per word) in the illustrative case. In addition, a fourth bit in the ECCP control register may be used to determine the "precision" for the data stored in memory. This bit chooses between the case of "soft decoding", wherein each incoming symbol is quantized into an 8-bit (256 level) word, and "hard decoding", wherein each incoming symbol is represented by a binary (2 level) bit. Still other implementations of the present shared memory technique are possible.

We claim:

1. An integrated circuit comprising a digital processor for performing a signal processing function, and further comprising a memory that stores at least one type of information selected from the group consisting of: instruction words, data words, and coefficients;

Characterized in that said integrated circuit further comprises a co-processor that implements a Viterbi decoding function, wherein said memory is time-shared between said digital processor and said co-processor, and further characterized in that said memory is partitioned between said digital processor and said co-processor so that a first portion defined by a first address space is used by said co-processor, and a second portion defined by a second address space is used by said digital processor.

2. The integrated circuit of claim 1 further characterized in that the partition between said first portion and said second portion is controlled by said co-processor so that only the amount of memory required by said co-processor is included in said first portion.

3. The integrated circuit of claim 1 wherein said time-shared memory is accessed by said digital processor and said co-processor through a multiplexer controlled by said co-processor.

4. The integrated circuit of claim 1 wherein said co-processor supplies to said digital processor a flag signal by means of a flag line, wherein said co-processor provides a first signal level to said flag line when said co-processor is performing a decoding operation, and provides a second signal level to said flag line at other times.

5. The integrated circuit of claim 1 wherein said co-processor supplies to said digital processor an interrupt signal pulse by means of an interrupt line when said co-processor relinquishes control of said shared memory to said digital processor.

6. An integrated circuit comprising a digital processor for performing a signal processing function, and further comprising a memory that stores at least one type of information selected from the group consisting of: instruction words, data words, and coefficients;

Characterized in that said integrated circuit further comprises a co-processor that implements a Viterbi decoding function, wherein said memory is time-shared between said digital processor and said co-processor, and wherein said time-shared memory is accessed by said digital processor and said co-processor through a multiplexer controlled by a control signal supplied by said co-processor by means of a control line, wherein said co-processor provides a first signal level to said control line when said co-processor is performing a decoding operation, and provides a second signal level to said control line at other times.

7. The integrated circuit of claim 6 wherein said co-processor further supplies to said digital processor a flag signal by means of a flag line, wherein said co-processor provides a first signal level to said flag line when said co-processor is performing a decoding operation, and provides a second signal level to said flag line at other times.

8. The integrated circuit of claim 6 further characterized in that said memory is partitioned between said digital processor and said co-processor so that a first portion defined by a first address space is used by said co-processor, and a second portion defined by a second address space is used by said digital processor.

9. The integrated circuit of claim 8 further characterized in that the partition between said first portion and said second portion is controlled by said co-processor so that only the amount of memory required by said co-processor is included in said first portion.

* * * * *